(12) United States Patent
Oka (10) Patent No.: US 6,777,264 B2
(45) Date of Patent: Aug. 17, 2004

(54) METHOD OF MANUFACTURING A SEMICONDUCTOR DEVICE HAVING A DIE PAD WITHOUT A DOWNSET

(75) Inventor: Takahiro Oka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/201,275

(22) Filed: Jul. 24, 2002

(65) Prior Publication Data

US 2003/0020177 A1 Jan. 30, 2003

Related U.S. Application Data

(62) Division of application No. 09/799,803, filed on Mar. 7, 2001, now abandoned.

(30) Foreign Application Priority Data

Mar. 7, 2000 (JP) ........................................ 2000-062268

(51) Int. Cl.[7] ........................ H01L 21/44; H01L 21/48; H01L 21/50
(52) U.S. Cl. ...................................... 438/107; 438/109
(58) Field of Search ............................... 438/106, 107, 438/109, 110; 257/686, 723, 730

(56) References Cited

U.S. PATENT DOCUMENTS

| | | | | |
|---|---|---|---|---|
| 5,012,323 A | * | 4/1991 | Farnworth | 257/723 |
| 5,952,725 A | * | 9/1999 | Ball | 257/777 |
| 6,045,886 A | * | 4/2000 | Oka et al. | 428/41.5 |
| 6,072,243 A | * | 6/2000 | Nakanishi | 257/783 |
| 6,265,760 B1 | * | 7/2001 | Inaba et al. | 257/666 |
| 6,552,437 B1 | * | 4/2003 | Masuda et al. | 257/777 |
| 6,558,791 B2 | * | 5/2003 | Matsuura et al. | 428/355 CN |

FOREIGN PATENT DOCUMENTS

| | | |
|---|---|---|
| JP | 5-55452 | 3/1983 |
| JP | 05-109975 | 4/1993 |
| JP | 5-3284 | 8/1993 |

* cited by examiner

Primary Examiner—Carl Whitehead, Jr.
Assistant Examiner—William Vesperman
(74) Attorney, Agent, or Firm—Volentine Francos, PLLC (57) ABSTRACT

A semiconductor device includes, a die pad having a top surface and a bottom surface, a first semiconductor chip having a top surface on which electrodes are formed and a bottom surface, and a second semiconductor chip having a top surface on which electrodes are formed, and a bottom surface, the second semiconductor chip being smaller than the first semiconductor chip, wherein the first chip top surface is fixed on the die pad bottom surface, the second chip bottom surface is fixed on the die pad top surface.

14 Claims, 7 Drawing Sheets

METHOD OF MANUFACTURING A SEMICONDUCTOR DEVICE HAVING A DIE PAD WITHOUT A DOWNSET

CROSS REFERENCE TO RELATED APPLICATIONS

This is a divisional application of application Ser. No. 09/799,803, filed Mar. 7, 2001, now abandoned, which is hereby incorporated by reference in its entirety for all purposes.

BACKGROUND OF THE INVENTION

The present invention relates to a semiconductor device, and to the method for manufacturing the same.

Figure 9:
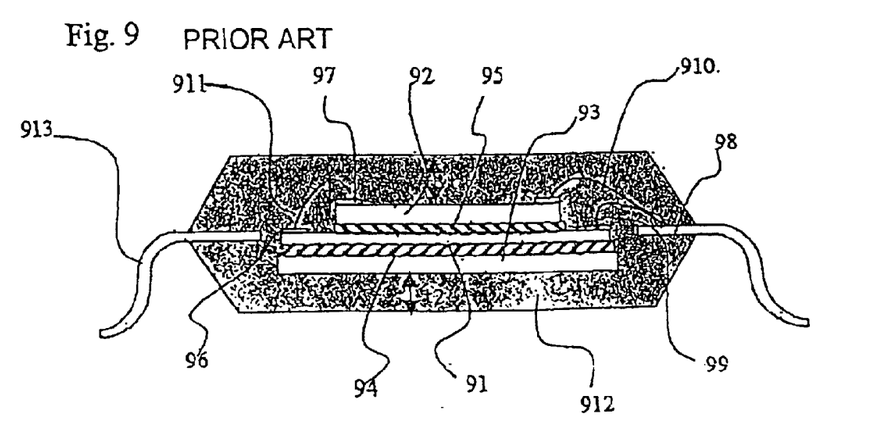
FIG. 9 shows a cross sectional view of a conventional semiconductor device.
Figure 10:
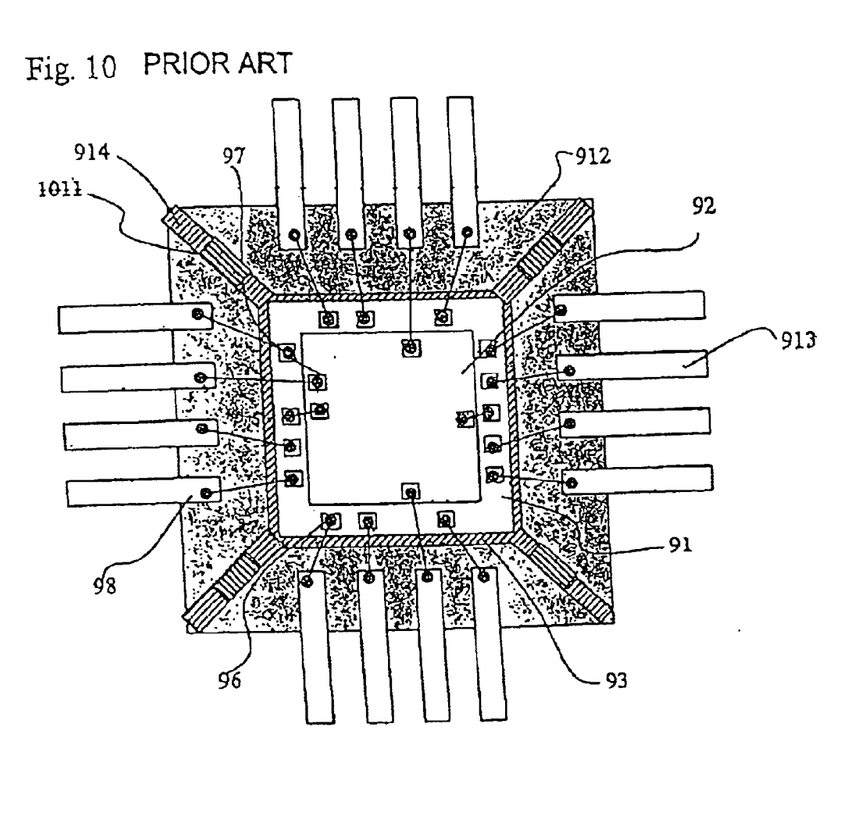
FIG. 10 shows a top view of the conventional semiconductor device.

FIG. 9 shows a schematic diagram of a conventional semiconductor device molded with resin. FIG. 10 shows a top-view of the semiconductor device. These drawings show a Quad Flat Package (QFP).

This semiconductor device has a first semiconductor chip 91, a second semiconductor chip 92, a die pad 93, a first adhesive layer 94, a second adhesive layer 95, electrodes 96 on the first semiconductor chip, electrodes 97 on the second semiconductor chip, inner leads 98, metal wires 99,910, a package portion 912, outer leads 913, and a pad support portion 914. The semiconductor chips 91 and 92 are stacked on a die pad 93.

The die pad 93 is lower than the inner leads 98 as shown in FIG. 9 and FIG. 10. The hanging portion of the pad support portion 914 is bent, and the die pad and the inner leads are not at the same level. The bent portion is indicated by reference numeral 1011 in FIG. 10, this structure is called a downset. The thickness t1 of the resin on the semiconductor chip 92 is the same as the thickness t2 of the resin under the die pad 93 in the conventional design. The resin is filled proportionally during transfer molding because the thickness of resin on the semiconductor chip 92 and the thickness of resin under the die pad 93 are the same. Therefore, a short-circuit of wires on the semiconductor chip 91 and the semiconductor chip 92 is prevented. The warping of the package is also prevented.

The semiconductor chip 91 is fixed over the die pad 93 by the first adhesive layer 94. The semiconductor chip 92 is fixed over the semiconductor chip 91 by the second adhesive layer 95.

The electrodes 96,97 on each of the semiconductor chips are connected to inner leads 98 via metal wires 99,910. For example, gold wires connect electrodes and inner leads. Some electrodes 97 on the semiconductor chip 92 are connected to the electrodes 96 on the semiconductor chip 91. After the wire bonding, a resin (for example, epoxy resin) is molded on semiconductor chips. After the forming of the package portion 12, the outer leads are plated with solder. The outer leads 913 are then transformed into a predetermined form.

SUMMARY OF THE INVENTION

An object of the present invention is to provide a semiconductor device and the method for manufacturing the same that do not need a downset process. Therefore the yield is improved during the formation of a lead frame.

According to an embodiment of this invention, a semiconductor device comprises, a die pad having a top surface and a bottom surface, a first semiconductor chip having a top surface on which electrodes are formed and a bottom surface, and a second semiconductor chip having a top surface on which electrodes are formed and a bottom surface, the second semiconductor chip being smaller than the first semiconductor chip, wherein the top surface of the first semiconductor chip is fixed on the bottom surface of the die pad, the bottom surface of the second semiconductor chip is fixed on the top surface of the die pad.

A method for manufacturing the semiconductor device comprises forming a first adhesive layer on a bottom surface of a die pad, forming a second adhesive layer on a top surface of the die pad, fixing a top surface of a first semiconductor chip on the first adhesive layer, fixing a bottom surface of a second semiconductor chip which is smaller than the first semiconductor chip on the second adhesive layer.

DETAILED DESCRIPTION OF THE PREFERRED EMBODIMENTS

Preferred embodiments are described below using drawings.

Figure 1:
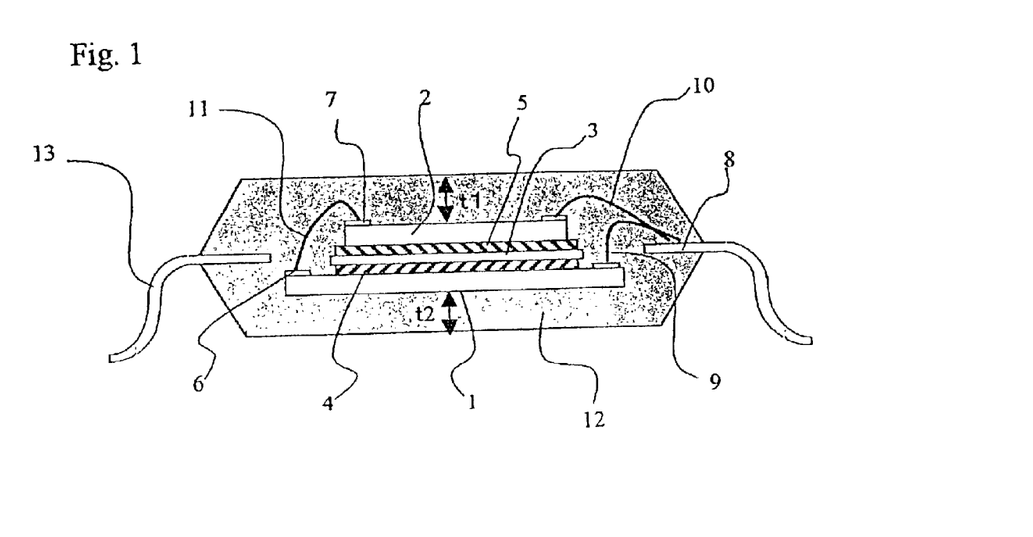
FIG. 1 shows a cross sectional view of a semiconductor device of a first preferred embodiment.
Figure 2:
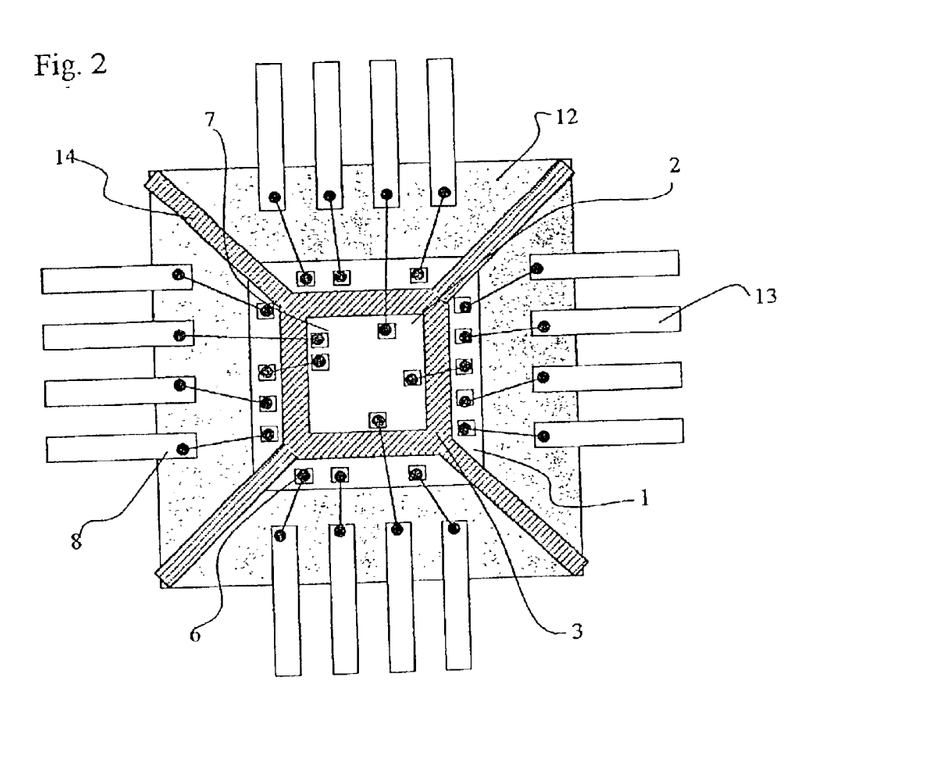
FIG. 2 shows a perspective diagram from the top view of the semiconductor device in the first preferred embodiment.

FIG. 1 shows a cross sectional view of the semiconductor device of a first preferred embodiment. FIG. 2 shows a perspective diagram from the top view of the semiconductor device in the first embodiment.

This semiconductor device has a first semiconductor chip 1, a second semiconductor chip 2, a die pad 3, a first adhesive layer 4, a second adhesive layer 5, electrodes 6 on the first semiconductor chip, electrodes 7 on the second semiconductor chip, inner leads 8, metal wires 9,10, a package portion 12, outer leads 13, and a pad support portion 14. The package is not limited to the drawings. For example, the inner leads 8 can be formed with an interconnection on Ball Grid Array (BGA) substrate.

The die pad 3 for mounting a semiconductor chip is not downset. The pad support portion 14 is not bent. Therefore, the die pad 3 and the inner leads 8 are formed on the same level. The second adhesive layer 5 is formed on the top surface of the die pad 3 (the die pad top surface) and the first adhesive layer 4 is formed on the bottom surface of the die pad 3 (die pad bottom surface). That is to say, the die pad 3 is disposed between the first and second adhesive layers.

The first semiconductor chip 1 is fixed on the first adhesive layer 4. The top surface of the first semiconductor chip 1 (first chip top surface) touches the first adhesive layer 4, and the first chip top surface is the main surface on which the circuits and electrodes are formed.

The second semiconductor chip 2 is fixed on the second adhesive layer 5. The bottom surface of the second semiconductor chip 2 (second chip bottom surface) touches the second adhesive layer 5, and the circuits are not formed on this bottom surface.

The electrodes 6 on the first semiconductor chip are connected to inner leads 8 via metal wires 9. The electrodes 7 on the second semiconductor chip are connected to inner leads 8 via metal wires 10. Some electrodes 6 on the first semiconductor chip 1 are connected to the electrodes 7 on the second semiconductor chip 2 via wires 11. The electrical signal of the semiconductor chips 1,2 is outputted through the electrodes 6,7, wires 9,10,11, inner leads 8, and outer leads 13.

The package portion 12 is formed by molding resin (for example, epoxy resin) on predetermined portion of the semiconductor device.

The total thickness of the first adhesive layer 4 plus the first semiconductor chip 1 is the same as the total thickness of the second adhesive layer 5 plus the second semiconductor chip 2. Therefore, The thickness t1 of the resin on the second semiconductor chip 2 is the same as the thickness t2 of the resin under the first semiconductor chip 1.

The die pad 3 is disposed between the first semiconductor chip 1 and the second semiconductor chip 2. Therefore, the hanging portion of the pad support portion 14 does not have to be bent.

The first semiconductor chip 1 is wider than the second semiconductor chip 2 and the die pad 3 in this embodiment. The electrodes 6 on the first semiconductor chip 1 are disposed outside of the region that is defined by the edge of the second semiconductor chip 2. The electrodes 6 on the first semiconductor chip and the electrodes 7 on the second semiconductor chip do not overlap from the top view as shown in FIG. 2.

The first chip top surface 1 is fixed on the first adhesive layer 4, and the second chip bottom surface 2 is fixed on the second adhesive layer 5. Therefore, all of the electrodes 6,7 are not covered with the die pad 3. It is desirable that the difference of the size between the first semiconductor chip 1 and the second semiconductor chip 2 is at least 0.3 mm in each side. This is a minimum width to form an interconnecting wire between the electrodes 6 on the first semiconductor chip 1 and the electrodes 7 on the second semiconductor chip 2.

The electrodes 7 on the second semiconductor chip and the electrodes 6 on the first semiconductor chip 1 do not overlap. Therefore, all of the wire bonding to connect electrodes 6 and electrodes 7, electrodes 6 and inner lead 8, and electrodes 7 and inner lead 8 are performed in the same step. The wire bonding is performed from the same side (die pad top surface side) in the first preferred embodiment, and there is no wire connected by wire bonding from another side (die pad bottom surface side), and the wire, which has a loop summit at the die pad bottom surface, does not exist. Therefore, the thickness of the semiconductor device can be decreased.

The die pad top surface 3 is preferably wider than the bottom surface of the semiconductor chip 2. The die pad bottom surface 3 is preferably smaller than the top surface of the semiconductor chip 1.

In the first preferred embodiment, the adhesive layer 5 is prevented from running onto the top surface of the semiconductor chip 1 because the die pad 3 is wider than the semiconductor chip 2, when the semiconductor chip 2 is fixed.

An insulating adhesive is used as the adhesive layer 4 because the adhesive layer 4 bonds the first chip top surface, which is formed with circuit, to the die pad 3.

A conductive adhesive (for example solder paste) can be used as the adhesive layer 5 because the second chip bottom surface 2 is fixed on the die pad 3. Therefore, electric potential can be applied to the second semiconductor chip accordingly. For example, a semiconductor device, which has a logic semiconductor chip and a memory semiconductor device, is suitable for use a conductive adhesive as the adhesive layer 5. A certain potential should be applied to the substrate of a conventional memory semiconductor chip in order to stabilize an operation, on the other hand, there are many cases that the logic semiconductor chip does not need some potential at its substrate, therefore, the logic semiconductor chip can be used as the first semiconductor chip and the memory semiconductor chip can be used as the second semiconductor chip in the first preferred embodiment.

There are some effects described below according to this preferred embodiment.

This semiconductor device has a simple structure without downset. Therefore the yield of the lead-frame is improved during manufacturing, and the cost of manufacturing is declined.

The transformation of the lead frame is decreased during the carry and the molding. Because this semiconductor device does not have an downset structure. Therefore the yield of the assembly process is improved, and the cost of manufacturing is declined.

There is a die pad 3 between the first semiconductor chip 1 and the second semiconductor chip 2. Therefore, the noises between the semiconductor chips 1, 2 is decreased, and high speed signals can be applied to the semiconductor chips.

The area of the die pad 3 relates to the effect of noise reduction.

The second preferred embodiment is described below.

Figure 3:
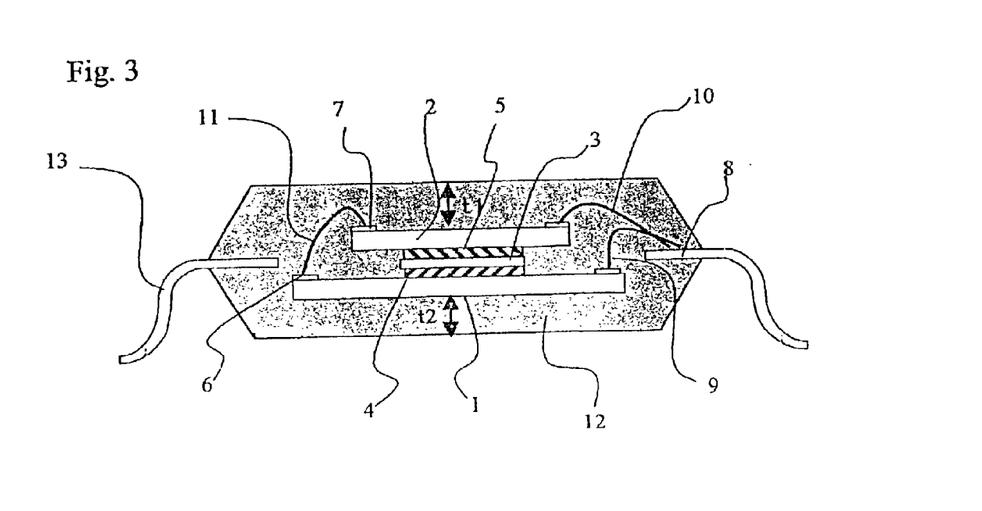
FIG. 3 shows a cross sectional view of a semiconductor device of a second preferred embodiment.
Figure 4:
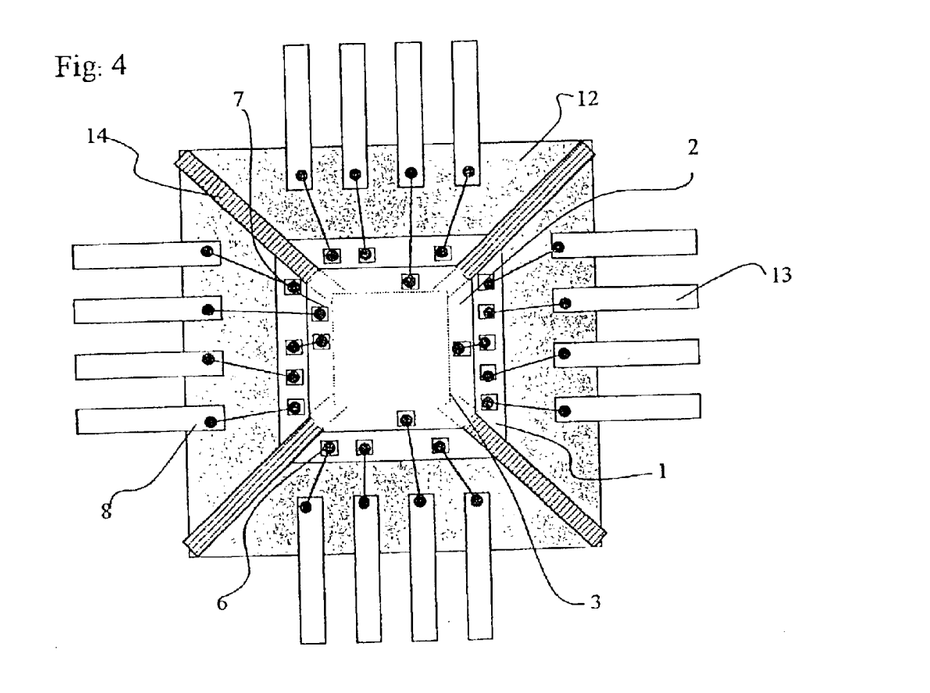
FIG. 4 shows a perspective diagram from the top view of the semiconductor device of the second preferred embodiment.

FIG. 3 shows a cross sectional view of the semiconductor device of the second preferred embodiment. FIG. 4 shows a perspective diagram from the top view of the semiconductor device in the second embodiment. The same reference numerals are applied for the elements those are described in the first embodiment.

The die pad 3 of the second preferred embodiment is not downset either.

The area of the die pad 3 is much smaller than the areas of the first semiconductor chip 1 and the second semiconductor chip 2. It is desirable that the area of the die pad 3 is smaller than half of the top surface area of the first semiconductor chip 1. The first chip top surface 1 is fixed on the die pad 3.

The die pad 3 is smaller than the semiconductor chips 1 and 2 in this embodiment. The contact area between the first semiconductor chip 1 and the die pad 3 shrinks because the area of the die pad 3 is small. Therefore the stress and the damage on the surface of the first semiconductor chip are decreased.

Consequently, this semiconductor device of the embodiment does not need a coating layer on the first chip top surface 1 because the passivation layer is enough to protect the top surface from damage. The coating process is reduced and the cost of manufacturing declines.

The amount of adhesive required to fix the semiconductor chips is reduced because the area of the die pad 3 is small. It also becomes easy to spread the adhesive uniformly on the total surface of the die pad 3. Therefore the adhesive strength is enough to fix each semiconductor chip.

The electrodes 7 on the second semiconductor chip and the electrodes 6 on the first semiconductor chip 1 do not overlap in the same way as the first embodiment. Therefore, all of the wire bonding are performed substantially in the same step.

In other words, all of the wire bonding are performed without a step of turning over the semiconductor device.

The conductive adhesive can be used as the adhesive layer 5 in the second embodiment in the same way as the first embodiment. Therefore, the logic semiconductor chip can be used as the first semiconductor chip and the memory semiconductor chip can be used as the first semiconductor chip in the first preferred embodiment.

FIGS. 5A–5D show cross sectional views of the method for manufacturing the semiconductor device according to the third preferred embodiment. The same reference numerals are applied for the elements those are described in the first preferred embodiment.

Figure 5A:
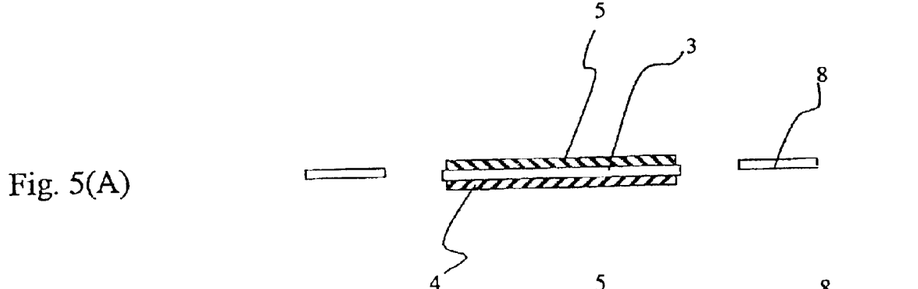
FIG. 5 shows a cross sectional view of the method for manufacturing the semiconductor device of the third preferred embodiment.

The die pad 3, which is not downset, is prepared as shown in FIG. 5A. The insulating adhesive layer (first adhesive layer) 4 is formed on a bottom surface of the die pad 3. The insulating or conductive adhesive layer 5 (second adhesive layer) is formed over a top surface of the die pad 3. Thermosetting adhesive paste, thermoplastic adhesive paste, thermosetting adhesive tape, or thermoplastic adhesive tape may be used as these adhesive layers. These adhesive layers preferably have some viscosity before hardening. This viscosity allows a semiconductor chip to be aligned on the die pad 3.

Figure 5B:
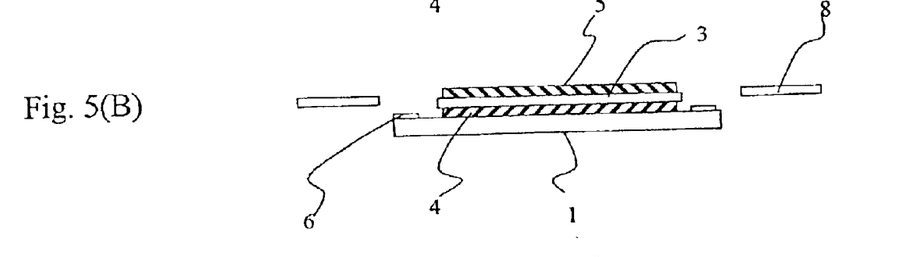

The first semiconductor chip 1 is put on the die pad bottom surface as shown in FIG. 5B. The first semiconductor chip 1, the first adhesive layer 4 and the die pad 3 are heated from the lower side of the first semiconductor chip 1. The adhesive layer 4 fixes the first semiconductor chip 1 on the die pad 3 after this heat treatment.

Figure 5C:
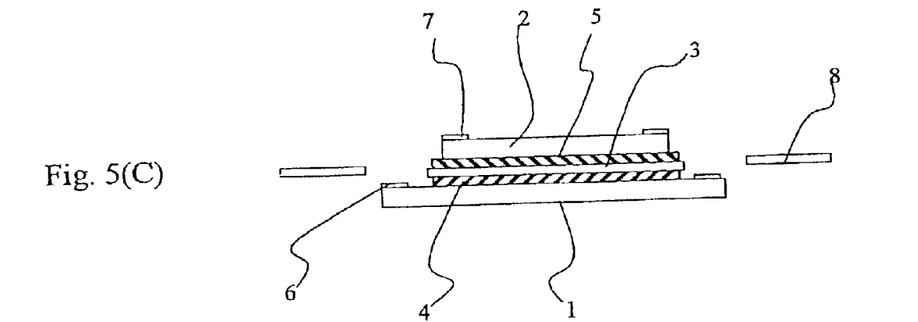

The second semiconductor chip 2 is put over the die pad top surface 3 as shown in FIG. 5C. The second semiconductor chip 2, the second adhesive layer 5 and the die pad 3 are heated from the lower side of the first semiconductor chip 2. The adhesive layer 5 fixes the second semiconductor chip 2 on the die pad 3 after this heat treatment.

Figure 5D:
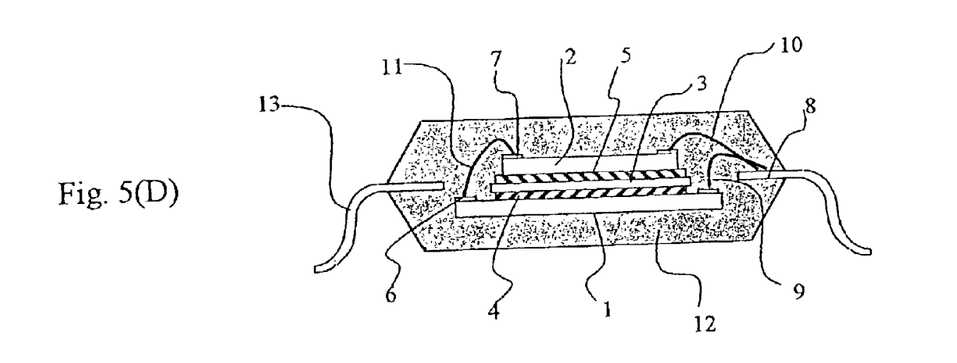
Figure 6A:
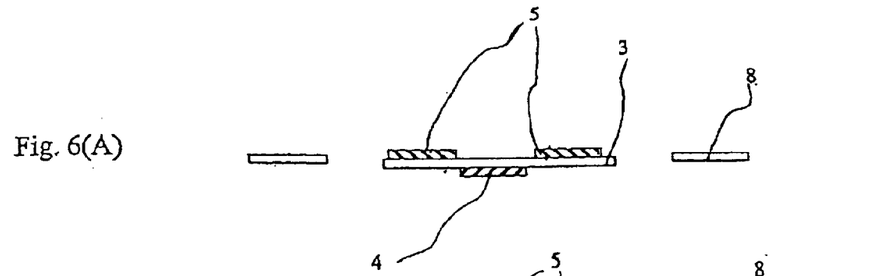
FIG. 6 shows a cross sectional view of the method for manufacturing a semiconductor device of the fourth preferred embodiment.
Figure 6B:
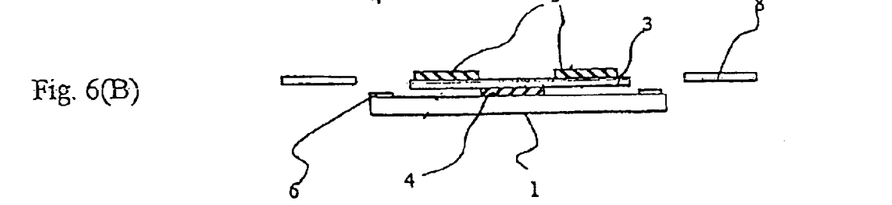
Figure 6C:
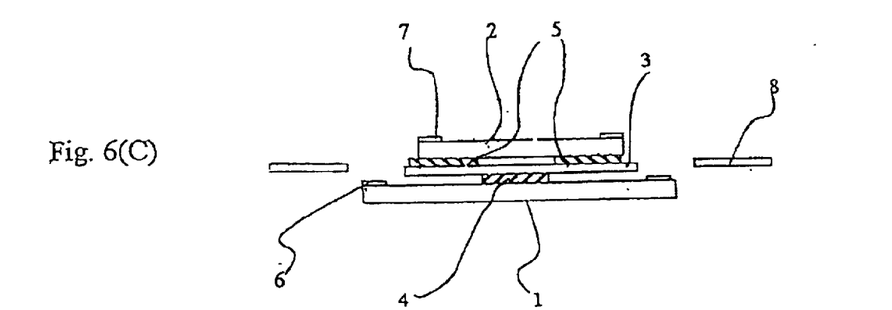
Figure 6D:
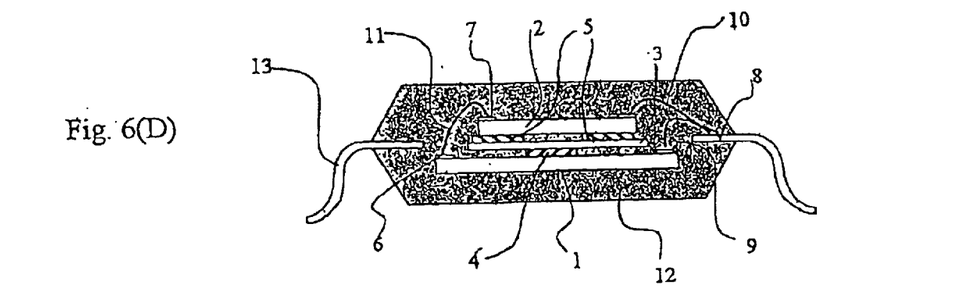
Figure 7A:
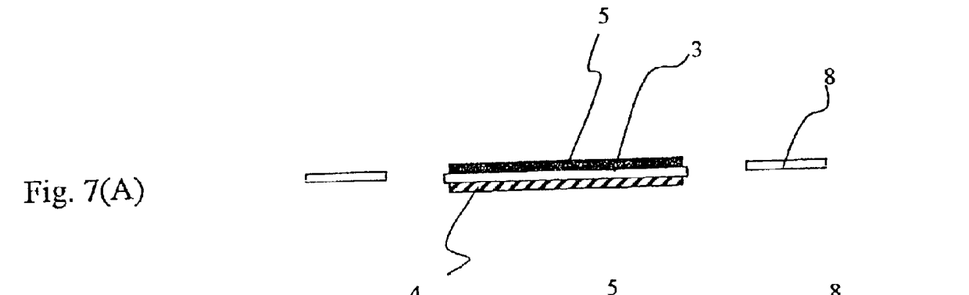
FIG. 7 shows a cross sectional view of the method for manufacturing a semiconductor device of the fifth preferred embodiment.
Figure 7B:
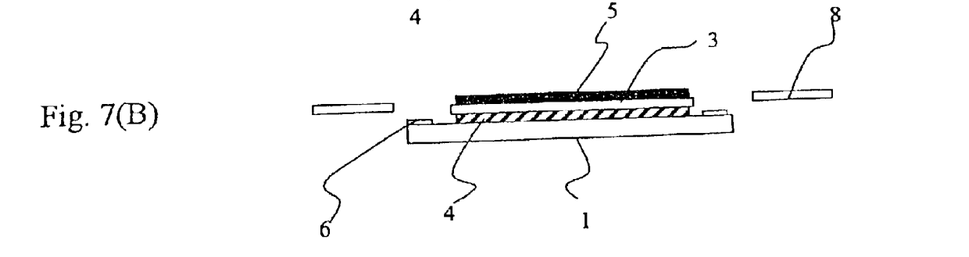
Figure 7C:
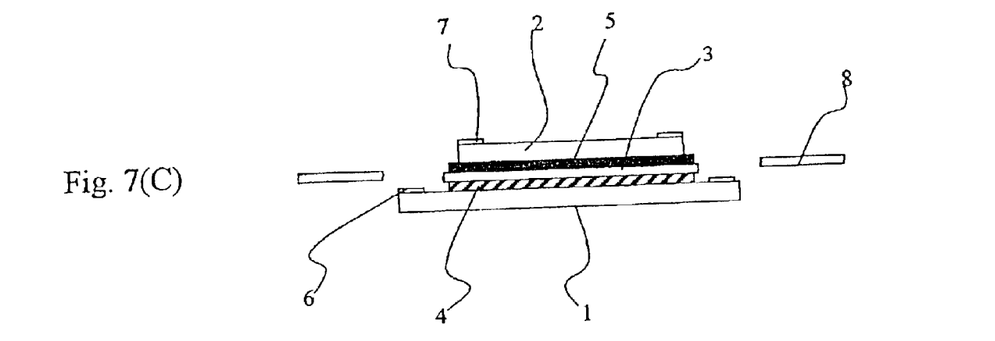
Figure 7D:
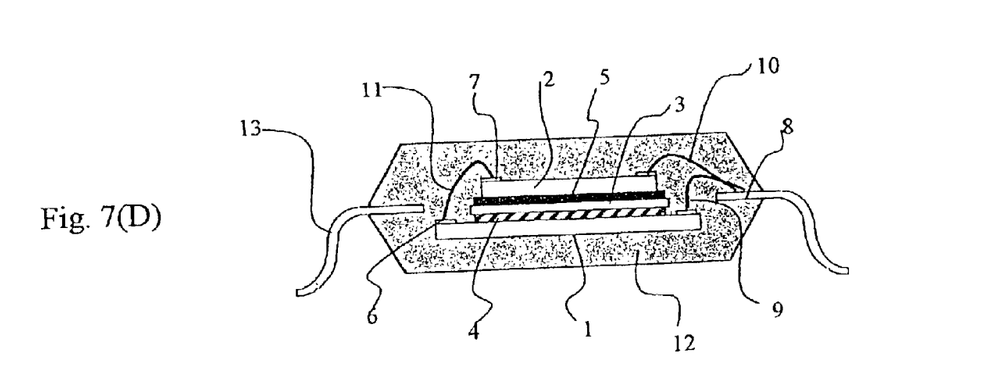
Figure 8A:
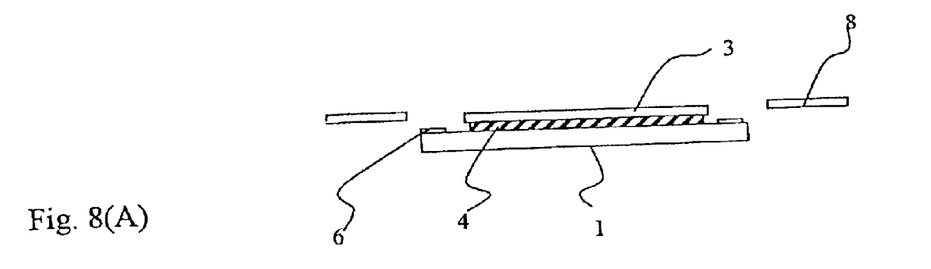
FIG. 8 shows a cross sectional view diagram of the method for manufacturing a semiconductor device of the sixth preferred embodiment.
Figure 8B:
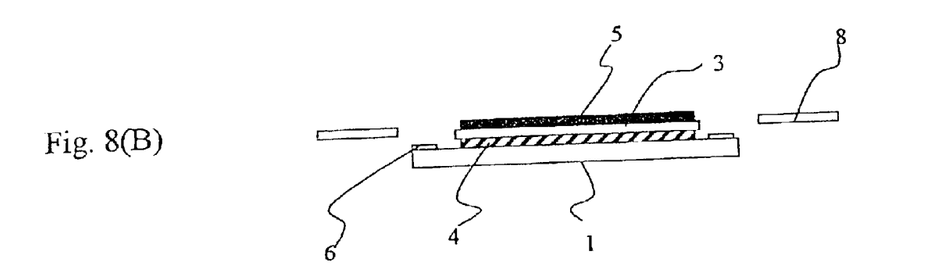
Figure 8C:
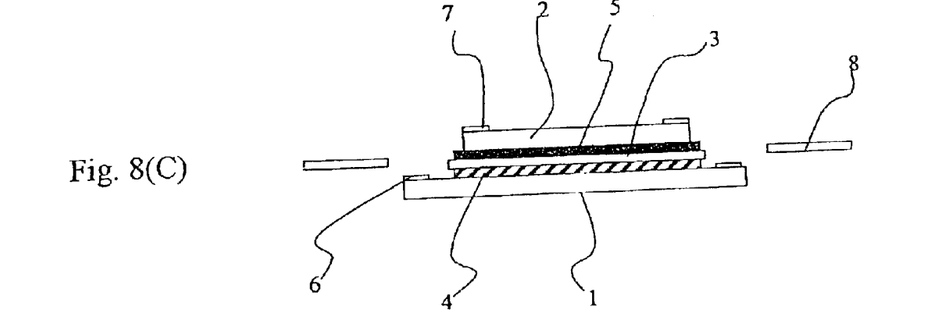
Figure 8D:
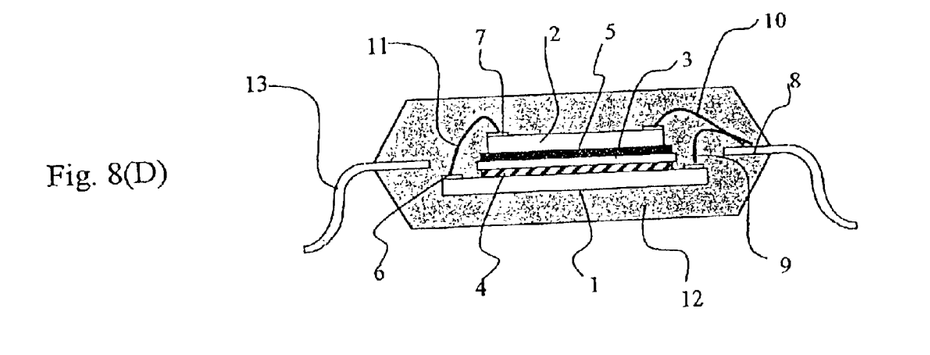

The final hardening of the adhesive layers is performed, and the semiconductor chips are perfectly fixed on the die pad 3. This fixing process is called a die bonding process. Electrodes 6, 7 on the semiconductor chips 1, 2 are then electrically connected to inner leads 8 or another electrode via metal wire 9–11. Then, the molding process is performed.

There are some effects described below according to this preferred embodiment.

The manufacturing step is simplified because the downset process is lessened. Therefore the yield of the lead-frame is improved during manufacturing, and the cost of manufacturing is reduced.

The adhesive layers are formed before the semiconductor chips are put on the die pad 3. Therefore the spread of the adhesive layer can be easily controlled when the semiconductor chips are pressed on the die pad 3. The possibility that the adhesive layer 5 runs onto the top surface of the semiconductor chip 1 is decreased. Therefore the distance between the edge of the first semiconductor chip 1 and the edge of the second semiconductor chip 2 is minimized. This minimized distance means the shortest distance that the electrodes 6 on the first semiconductor chip 1 can be connected to the electrodes 7 on the second semiconductor chip 2 via metal wire.

The wire bonding ban be performed from the same side (die pad top surface side) and in the same step in the first preferred embodiment. The wire, which has a loop summit at the die pad bottom surface, does not exist. Therefore, turning over the semiconductor device does not have to be performed to perform wire bonding of another side.

FIG. 6 shows a cross sectional view of the method for manufacturing the semiconductor device of a fourth preferred embodiment. The same reference numerals are applied for the elements those are described in the first preferred embodiment.

The die pad 3, which is not downset, is prepared. The insulating adhesive layer 4 (first adhesive layer) is formed on a bottom surface of the die pad 3. The insulating or conductive adhesive layer 5 (second adhesive layer) is formed on a top surface of the die pad 3. Thermosetting adhesive paste, thermoplastic adhesive paste, thermosetting adhesive tape, or thermoplastic adhesive tape may be used as these adhesive layers. These adhesive layers have some viscosity before hardening. This viscosity allows aligning a semiconductor chip on the die pad 3.

The first adhesive layer 4 and the second adhesive layer 5 are partly formed on each surface in this embodiment. The portion on which the first adhesive layer 4 is formed in the die pad bottom surface does not correspond to the portion on which the second adhesive layer 5 is formed on the die pad top surface.

For example, thermosetting adhesive is used as the adhesive layers 4, 5. When the first semiconductor chip 1 is fixed, only the first portion, which the first adhesive layer 4 is formed on, are heated. The retained heat does not have an influence on the second adhesive layer 5. Therefore, the second adhesive layer 5 is protected from the changing of the viscosity property.

The method of manufacturing of the fourth embodiment is described below. This method is approximately the same as the third embodiment.

The adhesive layers 4, 5 are formed on each surface of the die pad 3 as described above.

The first semiconductor chip 1 is put on the die pad bottom surface. The first adhesive layer 4, that is the portions that preferably correspond to the first adhesive layer 4 on the first semiconductor chip 1 and the die pad 3, are heated. The adhesive layer 4 fixes the first semiconductor chip 1 on the die pad 3 after this heat treatment.

The second semiconductor chip 2 is put over the die pad top surface 3. The second semiconductor chip 2, the second adhesive layer 5 and the die pad 3 are heated from the lower side of the first semiconductor chip 1. The second adhesive layer 5 fixes the second semiconductor chip 2 on the die pad 3 after this heat treatment.

The final hardening of the adhesive layers is performed, and the first and second semiconductor chips are perfectly fixed on the die pad 3.

The second adhesive layer 5 and the corresponding portion in the die pad 3 are not heated directly during the heat treatment to fix the first semiconductor chip 1. Therefore the second adhesive layer 5 is protected from the changing of the viscosity property.

FIG. 7 shows a cross sectional view of the method for manufacturing the semiconductor device of a fifth preferred embodiment. The same numerals are applied for the elements those are described in the first embodiment.

The die pad 3, which is not downset, is prepared. The insulating adhesive layer 4 (first adhesive layer) is formed on the bottom surface of the die pad 3. The insulating or conductive adhesive layer 5 (second adhesive layer) is formed on the top surface of the die pad 3. Thermosetting adhesive paste, thermoplastic adhesive paste, thermosetting adhesive tape, or thermoplastic adhesive tape can be used as these adhesive layers 4, 5. These adhesive layers 4,5 preferably have some viscosity before hardening. This viscosity allows a semiconductor chip to be aligned on the die pad 3.

The softening (or hardening) temperature of the first adhesive layer 4 is different from that of the second adhesive layer 5 in this embodiment.

For example, the same thermoplastic adhesive can be used as the adhesive layers. The first semiconductor chip 1 is fixed before the second semiconductor chip 2 is fixed. Then the second adhesive layer is softened by heating from the lower side of the first semiconductor chip 1. The first adhesive layer 1 may be softened during this second heat treatment. The softening of the first adhesive layer 4 during the second heat treatment is not preferable since this would prevent the first semiconductor chip from being fixed tightly and precisely. If the softening temperature of the first adhesive layer is higher than that of the second adhesive layer, this problem does not occur.

For example, if the softening temperature of the first adhesive layer 74 is 100° C. and the softening temperature of the second adhesive layer is 50° C. the fixing would be performed more tightly.

Therefore using different adhesive layers respectively having different softening temperature for each surface makes the fixing of the semiconductor chips more precise and tight.

The method of manufacturing of the fifth embodiment using thermoplastic adhesive as an example is described below in order to more fully illustrate this embodiment. This is the opposite example of thermo characteristic to the above example. This method is substantially similar to the third embodiment.

The die pad 3, which is not downset, is prepared. The insulating adhesive layer 4 (first adhesive layer) is formed on bottom surface of the die pad 3. The softening temperature of the first adhesive layer is about 50° C.

The insulating or conductive adhesive layer 5 (second adhesive layer) is formed on top surface of the die pad 3. The softening temperature of the second adhesive layer is about 100° C.

The first semiconductor chip 1 is put on the die pad bottom surface 3. The first semiconductor chip 1, the first adhesive layer 4 and the die pad 3 are heated at the temperature of 50° C. from the lower side of the first semiconductor chip 1. The adhesive layer 4 is hardened because this is a thermosetting adhesive, and it fixes the first semiconductor chip 1 on the die pad 3 after this heat treatment. The second adhesive layer is not hardened during this heat treatment because softened temperature is higher than about 50° C.

The second semiconductor chip 2 is put over the die pad top surface 3. The second semiconductor chip 2, the second adhesive layer 5 and the die pad 3 are heated at the temperature of about 100° C. from the lower side of the first semiconductor chip 2. The adhesive layer 4 is hardened and it fixes the first semiconductor chip 1 on the die pad 3 after this heat treatment.

The final hardening of the adhesive layers is performed, and the semiconductor chips are perfectly fixed on the die pad 3.

FIG. 8 shows a cross sectional view of the method for manufacturing the semiconductor device of the sixth preferred embodiment. The same reference numerals are applied for the elements those are described in the first embodiment.

The featuring point of this embodiment is that the second adhesive layer 5 is formed after the first semiconductor chip is fixed. One of thermosetting adhesive paste, thermoplastic adhesive paste, thermosetting adhesive tape, or thermoplastic adhesive tape are preferably used as adhesive layers.

The die pad 3, which is not downset, is prepared. The insulating adhesive layer 4 (first adhesive layer) is formed on the bottom surface of the die pad 3.

The first semiconductor chip 1 is put on the die pad bottom surface 3. The first semiconductor chip 1, the first adhesive layer 4 and the die pad 3 are heated from the lower side of the first semiconductor chip 1. The adhesive layer 4 fixes the first semiconductor chip 1 on the die pad 3 after this heat treatment.

Then, The insulating or conductive adhesive layer 5 (second adhesive layer) is formed over the top surface of the die pad 3.

The second semiconductor chip 2 is put over the die pad top surface 3. The second semiconductor chip 2, the second adhesive layer 5 and the die pad 3 are heated from the lower side of the first semiconductor chip 2. The adhesive layer 5 fixes the second semiconductor chip 2 on the die pad 3 after this heat treatment.

The final hardening of the adhesive layers is performed, and the semiconductor chips are perfectly fixed on the die pad 3. This fixing process is called a die bonding process. Electrodes of the semiconductor chips are electrically connected to inner leads or another electrode via metal wire 9–11. Then a molding process is performed.

In this embodiment, the second adhesive layer can be selected according to the needs, because the second adhesive layer is formed after the fixing of the first semiconductor chip. It can be selected in this method whether the second chip bottom surface must have potential or not even after the first semiconductor chip has fixed.

This invention is not limited by these embodiments.

What is claimed is:

1. A method for manufacturing a semiconductor device, comprising:

forming a first adhesive layer over a die pad bottom surface;

forming a second adhesive layer over a die pad top surface;

fixing a top surface of a first semiconductor chip on the first adhesive layer, the top surface of the first semiconductor chip having a first plurality of electrodes thereon; and fixing a bottom surface of a second semiconductor chip, which is smaller than the first semiconductor chip, on the second adhesive layer, a top surface of the second semiconductor chip having a second plurality of electrodes thereon, wherein an area of the die pad is less than half an area of the first semiconductor chip.

2. The method according to claim 1, wherein said forming the second adhesive layer is performed after fixing the first adhesive layer.

3. The method according to claim 1, wherein the first adhesive layer and the second adhesive layer have a thermosetting characteristic.

4. The method according to claim 3, wherein a second hardening temperature of the second adhesive layer is higher than a first hardening temperature of the first adhesive layer.

5. The method according to claim 3, wherein the first adhesive layer and the second adhesive layer are respectively partly formed on the die pad top surface and the die pad bottom surface,
a first portion of the die pad bottom surface on which the first adhesive layer is formed is different from a second portion of the die pad top surface on which the second adhesive layer is formed, so that the first and second adhesive layers do riot overlap.

6. The method according to claim 1, wherein the first adhesive layer and the second adhesive layer have a thermoplastic characteristic.

7. The method according to claim 6, wherein a second softening temperature of the second adhesive layer is lower than a first softening temperature of the first adhesive layer.

8. The method according to claim 6, wherein the first adhesive layer and the second adhesive layer are respectively partly formed on the die pad top surface and the die pad bottom surface,
a first portion of the die pad bottom surface on which the first adhesive layer is formed is different from a second portion of the die pad top surface on which the second adhesive layer is formed, so that the first and second adhesive avers do not overlap.

9. The method according to claim 1, further comprising:
connecting some of the first plurality of electrodes on the first semiconductor chip to some of the second plurality of electrodes on the second semiconductor chip,
wherein the electrodes on the first semiconductor chip are disposed on an outside region thereof that is defined by an edge of the second semiconductor chip.

10. The method according to claim 1, further comprising:
first connecting at least one of the first plurality of electrodes on the first semiconductor chip to at least one of inner leads; and
second connecting at least one of the second plurality of electrodes on the second semiconductor chip to at least one of the inner leads,
wherein said first connecting and said second connecting are performed subsequently in a same step.

11. A method of manufacturing a semiconductor device, comprising:
forming a first adhesive layer over a die pad bottom surface;
forming a second adhesive layer over a die pad top surface;
fixing a top surface of a first semiconductor chip on the first adhesive layer, the top surface of the first semiconductor chip having a first plurality of electrodes thereon; and
fixing a bottom surface of a second semiconductor chip, which is smaller than the first semiconductor chip, on the second adhesive layer, a top surface of the second semiconductor chip having a second plurality of electrodes thereon,
wherein the first adhesive layer and the second adhesive layer have a thermosetting characteristic, and
wherein a second hardening temperature of the second adhesive layer is higher than a first hardening temperature of the first adhesive layer.

12. A method of manufacturing a semiconductor device, comprising:
forming a first adhesive layer over a die pad bottom surface;
forming a second adhesive layer over a die pad top surface;
fixing a top surface of a first semiconductor chip on the first adhesive layer, the top surface of the first semiconductor chip having a first plurality of electrodes thereon; and
fixing a bottom surface of a second semiconductor chip, which is smaller than the first semiconductor chip, on the second adhesive layer, a top surface of the second semiconductor chip having a second plurality of electrodes thereon,
wherein the first adhesive layer and the second adhesive layer have a thermoplastic characteristic, and
wherein a second softening temperature of the second adhesive layer is lower than a first softening temperature of the first adhesive layer.

13. A method of manufacturing a semiconductor device, comprising:
forming a first adhesive layer over a die pad bottom surface;
forming a second adhesive layer over a die pad top surface;
fixing a top surface of a first semiconductor chip on the first adhesive layer, the top surface of the first semiconductor chip having a first plurality of electrodes thereon; and
fixing a bottom surface of a second semiconductor chip, which is smaller than the first semiconductor chip, on the second adhesive layer, a top surface of the second semiconductor chip having a second plurality of electrodes thereon,
wherein the first adhesive layer and the second adhesive layer have a thermosetting characteristic, and
wherein the first adhesive layer and the second adhesive layer are respectively partly formed on the die pad top surface and the die pad bottom surface,
a first portion of the die pad bottom surface on which the first adhesive layer is formed is different from a second portion of the die pad top surface on which the second adhesive layer is formed, so that the first and second adhesive layers do not overlap.

14. A method of manufacturing a semiconductor device, comprising:
forming a first adhesive layer over a die pad bottom surface;
forming a second adhesive layer over a die pad top surface;
fixing a top surface of a first semiconductor chip on the first adhesive layer, the top surface of the first semiconductor chip having a first plurality of electrodes thereon; and
fixing a bottom surface of a second semiconductor chip, which is smaller than the first semiconductor chip, on the second adhesive layer, a top surface of the second semiconductor chip having a second plurality of electrodes thereon,
wherein the first adhesive layer and the second adhesive layer have a thermoplastic characteristic, and
wherein the first adhesive layer and the second adhesive layer are respectively partly formed on the die pad top surface and the die pad bottom surface,
a first portion of the die pad bottom surface on which the first adhesive layer is formed is different from a second portion of the die pad top surface on which the second adhesive layer is formed, so that the first and second adhesive layers do not overlap.

* * * * *